US012575367B2

(12) United States Patent
Gautam et al.

(10) Patent No.: US 12,575,367 B2
(45) Date of Patent: Mar. 10, 2026

(54) SUSCEPTOR TRANSFER FOR PROCESS CHAMBER

(71) Applicant: Applied Materials, Inc., Santa Clara, CA (US)

(72) Inventors: Ribhu Gautam, Sunnyvale, CA (US); Shu-Kwan Lau, Sunnyvale, CA (US); Masato Ishii, Sunnyvale, CA (US); Miao-Chun Chen, Sunnyvale, CA (US); Kuan Chien Shen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 383 days.

(21) Appl. No.: 18/299,119

(22) Filed: Apr. 12, 2023

(65) Prior Publication Data

US 2024/0105485 A1 Mar. 28, 2024

Related U.S. Application Data

(60) Provisional application No. 63/452,757, filed on Mar. 17, 2023, provisional application No. 63/409,417, filed on Sep. 23, 2022.

(51) Int. Cl.
*H01L 21/677* (2006.01)
*H01L 21/687* (2006.01)
(52) U.S. Cl.
CPC .. *H01L 21/67748* (2013.01); *H01L 21/68707* (2013.01)
(58) Field of Classification Search
CPC ......... H01J 37/32899; H01L 21/67748; H01L 21/68707
See application file for complete search history.

(56) References Cited

U.S. PATENT DOCUMENTS

| | | |
|---|---|---|
| 2003/0190220 A1 | 10/2003 | White et al. |
| 2012/0325148 A1 | 12/2012 | Yamagishi et al. |
| 2017/0025300 A1 | 1/2017 | Bluck et al. |
| 2022/0051918 A1* | 2/2022 | Savandaiah ............. C23C 16/54 |
| 2022/0403507 A1* | 12/2022 | Raaijmakers ..... H01L 21/67196 |

FOREIGN PATENT DOCUMENTS

| | | |
|---|---|---|
| JP | 2012028385 A | 2/2012 |
| KR | 10-2010-0103611 A | 9/2010 |
| WO | 2020139030 A1 | 7/2020 |

OTHER PUBLICATIONS

PCT Notification of Transmittal of the International Search Report and the Written Opinion of the International Searching Authority for International Application No. PCT/US2023/065648; dated Jul. 31, 2023.

* cited by examiner

*Primary Examiner* — Richard A Booth
(74) *Attorney, Agent, or Firm* — Patterson + Sheridan, LLP

(57) ABSTRACT

A method of moving a susceptor in a processing system, suitable for use in semiconductor processing, is provided. The method includes: moving a first susceptor from an interior volume of a first enclosure to an interior volume of a process chamber during a first time period; and positioning, during a second time period, a first substrate on the first susceptor when the first susceptor is in the process chamber, wherein the interior volume of the first enclosure and interior volume of the process chamber are maintained at a non-atmospheric pressure from the beginning of the first time period until the end of the second time period.

19 Claims, 3 Drawing Sheets

SUSCEPTOR TRANSFER FOR PROCESS CHAMBER

CROSS-REFERENCE TO RELATED APPLICATIONS

This application claims priority to: (1) U.S. Provisional Patent Application Ser. No. 63/409,417, filed on Sep. 23, 2022; and (2) U.S. Provisional Patent Application Ser. No. 63/452,757, filed on Mar. 17, 2023, which are each incorporated by reference in their entirety.

BACKGROUND

Embodiments of the present disclosure generally relate to methods and related equipment configured for moving a susceptor and substrate through different portions of a processing system.

DESCRIPTION OF THE RELATED ART

Susceptors are often used when performing a process (e.g., a deposition) on a substrate, such as a semiconductor substrate. Substrates are positioned on the susceptor during the process. Susceptors are often replaced with new or different susceptor, for example to perform a different process or when process performance is out specification as the processes can be very sensitive to susceptor properties (e.g., particle deposits on a susceptor that can affect thermal performance). Replacement of a susceptor results in significant downtime (e.g., multiple hours or days) for the processing equipment as the replacement involves substantial disassembly and requalification of the processing equipment.

Accordingly, there is a need for improved methods and equipment that can reduce the downtime caused by susceptor replacement.

SUMMARY

In one embodiment, a method of moving a susceptor in a processing system, suitable for use in semiconductor processing, is provided. The method includes: moving a first susceptor from an interior volume of a first enclosure to an interior volume of a process chamber during a first time period; and positioning, during a second time period, a first substrate on the first susceptor when the first susceptor is in the process chamber, wherein the interior volume of the first enclosure and interior volume of the process chamber are maintained at a non-atmospheric pressure from the beginning of the first time period until the end of the second time period.

In another embodiment, a method of moving a susceptor in a processing system is provided. The method includes moving, by a first robot, a first susceptor from an interior volume of a first enclosure to an interior volume of a process chamber during a first time period; and positioning, by the first robot, a first substrate on the first susceptor during a second time period when the first susceptor is in the process chamber.

In another embodiment, a method of moving a susceptor in a processing system is provided. The method includes moving, a first susceptor through a first opening of a process chamber from an interior volume of a first enclosure to an interior volume of the process chamber during a first time period; and moving a first substrate through the first opening of the process chamber to position the first substrate on the first susceptor during a second time period when the first susceptor is in the process chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to methods and equipment configured for moving a susceptor and substrate through different portions of a processing system without having to significantly change the conditions (e.g., temperature, pressure, gases present) in the various interior volumes of the processing system. Replacing a susceptor in a process chamber (e.g., a deposition chamber) has conventionally been a manual process that entails significant downtime for a processing system along with significant changes to the interior volumes of the different portions of the processing system, such as bringing the interior volumes to atmospheric pressure from a vacuum pressure.

The methods and processing systems disclosed herein allow substrates and susceptors to be transferred through the processing system using equipment (e.g., robots) located inside the processing system. Furthermore, the same equipment (e.g., robots, load lock chambers, transfer chambers) can be used to move both the substrates and the susceptors. Moreover, the same openings (e.g., a slit valve opening leading into a process chamber) for the different portions of the processing system can be used to receive both the substrate and the susceptor, which can have different sizes (e.g., different diameters). Enabling susceptors to be replaced using equipment (e.g., robots) inside the processing system enables the downtime conventionally associated with susceptor replacement to be avoided. Using the same equipment (e.g., a same transfer robot) and other components (e.g., same slit valve openings) to transfer both substrates and susceptors can add the capability of automatically transferring susceptors without substantially increasing the footprint or capital cost of a processing system. Additionally, because the susceptors can be replaced in a process chamber, it is substantially easier to execute shorter production runs using different recipes that may call for different susceptors. Furthermore, since the susceptors are replaced using automated equipment, errors associated with the manual handling of the susceptors can be reduced or eliminated while the consistency of the handling and accuracy of the placement of the susceptors can be improved, which can lead to improved product uniformity for substrates processed on the susceptors.

Figure 1:
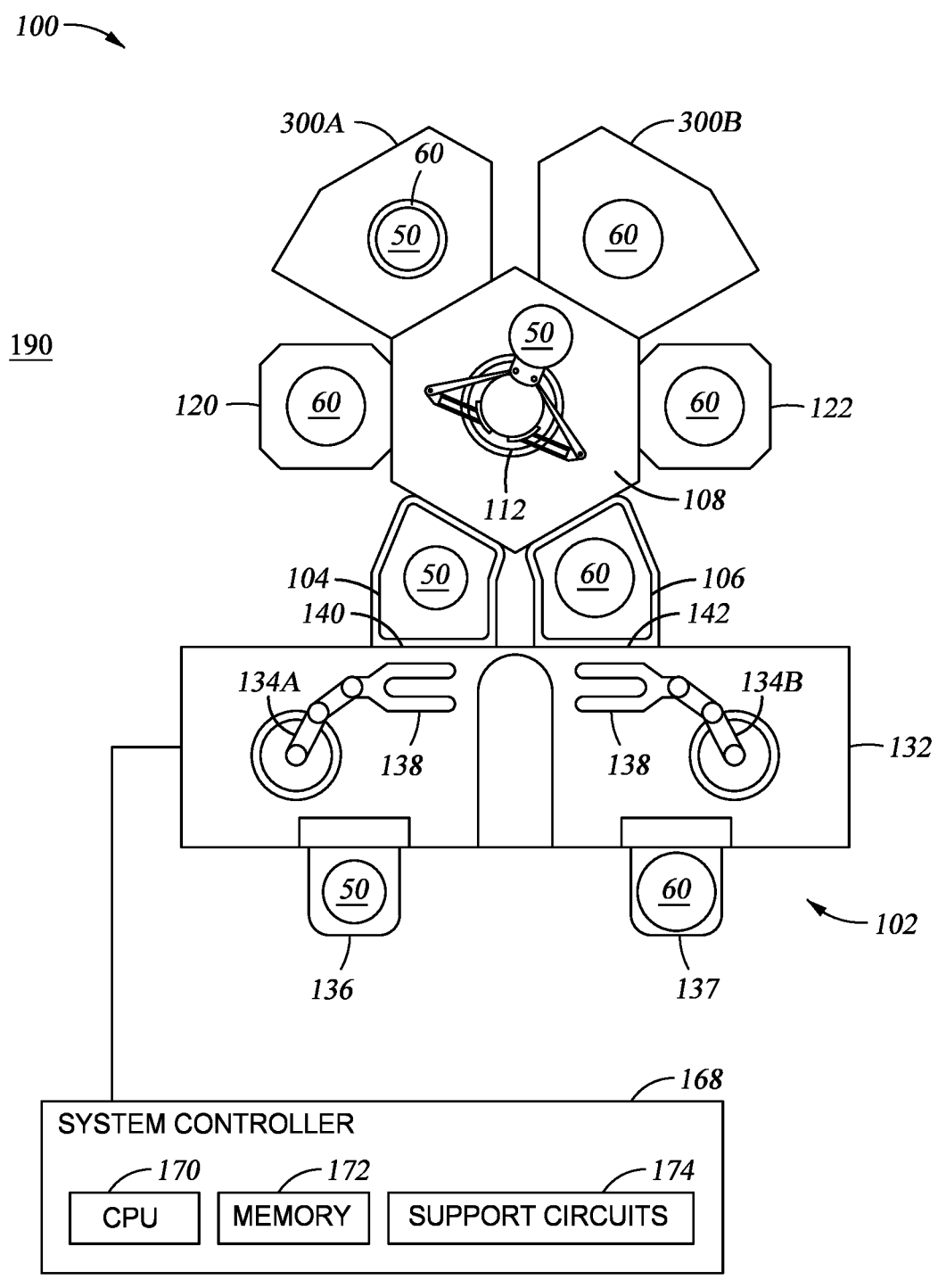
FIG. 1 is a schematic top view of a multi-chamber processing system, according to one embodiment.

FIG. 1 is a schematic top view of a multi-chamber processing system 100, according to one embodiment. The processing system 100 includes a factory interface 102, load lock chambers 104, 106, a transfer chamber 108, storage chambers 120, 122, and process chambers 300A, 300B. As detailed herein, substrates 50 and susceptors 60 can be transferred between the various portions of the processing system 100 without exposing the substrates 50 or susceptors 60 to an external ambient environment 190 (e.g., an atmospheric ambient environment such as may be present in a fab). For example, the substrates 50 and susceptors 60 can be transferred between the various chambers maintained at a low pressure or a vacuum pressure (e.g., less than or equal to about 300 Torr) without breaking the low pressure or vacuum environment in the processing system 100. While the processing system 100 is generally described as operating at a low pressure or vacuum pressure, the benefits of this disclosure also apply to systems operating at atmospheric pressure or pressures greater than atmospheric pressure with the benefits being that the susceptors can be transferred through the processing system while the interior volumes of the processing system are largely unaffected by these transfers and the interior volumes of the processing system are not exposed to the external ambient environment 190.

The factory interface 102 includes a docking station 132 and factory interface robots 134A, 134B (also referred to as transfer robots) to facilitate transfer of substrates 50 and susceptors 60. The docking station 132 is adapted to accept one or more front opening unified pods (FOUPs) 136, 137. The FOUP 136 is configured to store substrates 50. The FOUP 137 is configured to store susceptors 60. In some examples, each factory interface robot 134A, 134B generally includes an end effector 138 adapted to transfer the substrates 50 and/or susceptors 60 from the factory interface 102 to one of the load lock chambers 104, 106. Each transfer robot 134A, 134B and each load lock chamber 104, 106 can be configured for transferring substrates 50 and susceptors 60.

The load lock chambers 104, 106 connect the factory interface 102 to the transfer chamber 108. The transfer chamber 108 is connected to the process chambers 300A, 300B and to the storage chambers 120, 122. The transfer chamber 108 can include a transfer robot 112 that can transfer the substrates 50 and the susceptors 60 from one of the load lock chambers 104, 106 to one of the process chambers 300A, 300B. The transfer robot 112 can also transfer the susceptors 60 to one of the storage chambers 120, 122. The storage chambers 120, 122 can be used to store susceptors 60 that may be frequently used. The storage chambers 120, 122 are an optional component of the processing system 100. Although the storage chambers 120, 122 can be optional, when the storage chambers 120, 122 are used, then it can be unnecessary to use customized FOUPs designed for susceptors. Thus, in some embodiments, the storage chambers 120, 122 can eliminate the costs associated with customized FOUPs for susceptors as well as ensuring that other equipment in the processing system 100 are configured to work with the customized FOUPs, such as the transfer robots 134A, 134B.

In some embodiments, one or more of the load lock chambers 104, 106 and/or one or more of the storage chambers 120, 122 can include a removable lid or an exterior door connected to the external ambient environment 190. The removable lid or exterior door can enable a susceptor 60 to be positioned in the corresponding load lock chamber 104, 106 or storage chamber 120, 122 from the external ambient environment without having the susceptor 60 being transferred from a FOUP (e.g., FOUP 137) and through the docking station 132. Having the load lock chambers 104, 106 and/or the storage chambers 120, 122 include a removable lid or a door to the external ambient environment 190 can eliminate the costs associated with customized FOUPs for susceptors as well as ensuring that other equipment in the processing system 100 are configured to work with the customized FOUPs, such as the transfer robots 134A, 134B. The load lock chambers 104, 106 and the storage chambers 120, 122 can also each include an interior door to isolate the interior environment of the corresponding load lock chamber 104, 106 or storage chamber 120, 122 from the interior environment of the transfer chamber 108. This isolation can prevent other portions of the processing system from experiencing a pressure change when a susceptor 60 is added to one of the load lock chambers 104, 106 or one of the storage chambers 120, 122 through the opening related to the corresponding removable lid or exterior door.

The process chambers 300A, 300B can be any type of process chamber (e.g., deposition, etch, annealing, etc.) that is configured to use a susceptor. In one embodiment, as described in further detail below the process chambers 300A, 300B can be epitaxial deposition chambers.

The processing system 100 can further include a system controller 168 for controlling and monitoring the other components of the processing system 100. In operation, the system controller 168 enables data collection and feedback from the respective chambers and other equipment to coordinate performance of the processing system 100.

The system controller 168 generally includes a central processing unit (CPU) 170, memory 172, and support circuits 174. The CPU 170 may be one of any form of a general purpose processor that can be used in an industrial setting. The memory 172, or non-transitory computer-readable medium, is accessible by the CPU 170 and may be one or more of memory, such as random access memory (RAM), read only memory (ROM), floppy disk, hard disk, or any other form of digital storage, local or remote. The support circuits 174 are coupled to the CPU 170 and may comprise cache, clock circuits, input/output subsystems, power supplies, and the like. The various methods disclosed herein may generally be implemented under the control of the controller 168 by the CPU 170 executing code stored in the memory 172. When the code is executed by the CPU 170, the CPU 170 can control the different equipment in the processing system 100 to perform processes in accordance with the various methods described herein.

The processing system 100 shown in FIG. 1 is one embodiment of a processing system that can be used to transfer substrates and susceptors. Other processing systems can have different configurations, such as more or fewer processing chambers, different types of processing chambers, more or fewer (e.g., zero) storage chambers, etc.

Figure 2:
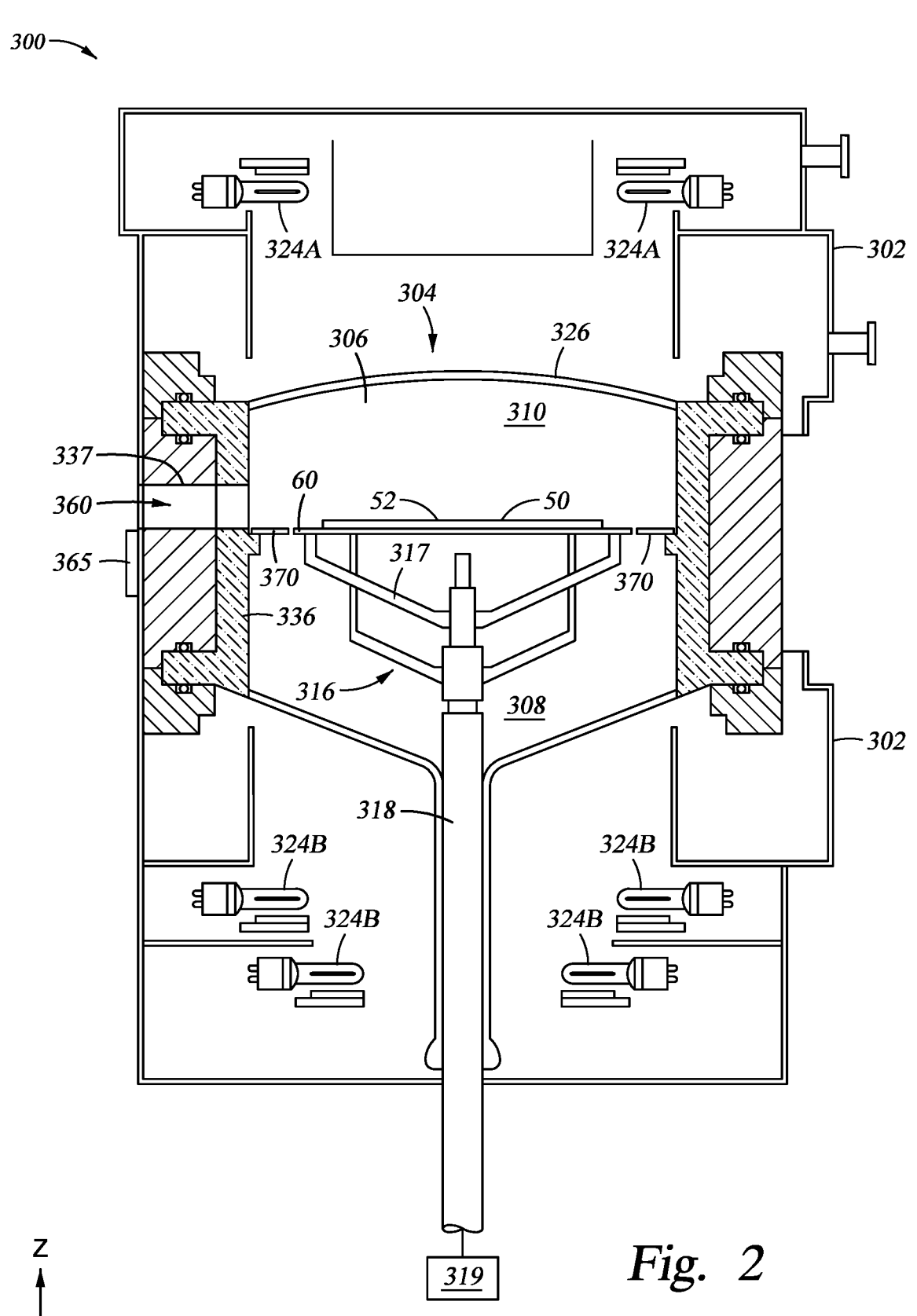
FIG. 2 is a cross sectional view of a processing chamber, according to one embodiment.

FIG. 2 is a cross sectional view of a processing chamber 300, according to one embodiment. The processing chamber 300 can be the process chamber 300A, 300B shown in FIG. 1. The processing chamber 300 can be configured to perform an epitaxial (Epi) deposition process. A susceptor 60 is positioned in the processing chamber 300. A substrate 50 is positioned on the susceptor 60. The process chamber 300 is configured to allow the exchange of substrates 50 and susceptors 60 through an opening 360, which can be opened by a slit valve 365 of the processing chamber 300.

The processing chamber 300 includes a housing structure 302 made of a process resistant material, such as aluminum or stainless steel, for example 316L stainless steel. The housing structure 302 encloses various functioning elements of the processing chamber 300, such as a quartz chamber 304, which includes an upper quartz chamber 306 and a lower quartz chamber 308. The quartz chamber 304 encloses a processing volume 310 (also referred to as interior volume). One or more liners 336, 337 can insulate the quartz chamber 304 from the housing structure 302.

The process chamber 300 includes a substrate support assembly 316. The substrate support assembly 316 can include supports 317 and a shaft 318. The susceptor 60 can be positioned on the supports 317, for example using the transfer robot 112 (see FIG. 1). The substrate support assembly 316 can further include an actuator 319 to raise and lower the supports 317 to enable the exchange of susceptors 60 and substrates 50 using the transfer robot 112. In some embodiments, the substrate support assembly 316 can include lift pins (not shown) that can raise and lower to facilitate the exchange of susceptors 60 and/or substrate 50 from the transfer robot 112. In some embodiments, a first set of lift pins can be configured to lift a susceptor 60 and a second set of lift pins can be configured to lift a substrate 50. For example, in one embodiment, the substrate support assembly 316 can include six supports 317 with three supports 317 having a lift pin to lift a susceptor 60 and three other supports 317 having a lift pin that can extend through a hole in the susceptor 60 to lift a substrate 50.

The susceptor 60 can be formed of a ceramic material or a graphite material coated with a silicon material, such as silicon carbide, or other process resistant material.

Reactive species can be provided to the processing volume 310 by a gas distribution assembly (not shown), and processing byproducts can be removed from the processing volume 310 by an outlet port (not shown), which is typically in communication with a vacuum source (not shown). In some embodiments, gases are provided into the outer portions of the processing volume 310, for example through one or more openings in the liners 336, 337. In these embodiments, the gas can flow from the outer portions to regions over the susceptor 60 and substrate 50 and then out through the outlet port.

Purge gas (not shown) can also be provided below the susceptor 60 to prevent the reactive species from entering the regions in the processing volume 310 below the susceptor 60. A preheat ring 370 can be positioned around the susceptor 60. The preheat ring 370 can be used to preheat the reactive species as the gases move from outer portions of the processing volume 310 to inner portions of the processing volume, for example over the susceptor 60. The preheat ring 370 can also be used to control the flow of purge gas around the susceptor 60.

Heating of the substrate 50 and/or the processing volume 310 may be provided by radiation sources, such as upper lamp modules 324A and lower lamp modules 324B. In one embodiment, the upper lamp modules 324A and the lower lamp modules 324B are infrared (IR) lamps.

Figure 3:
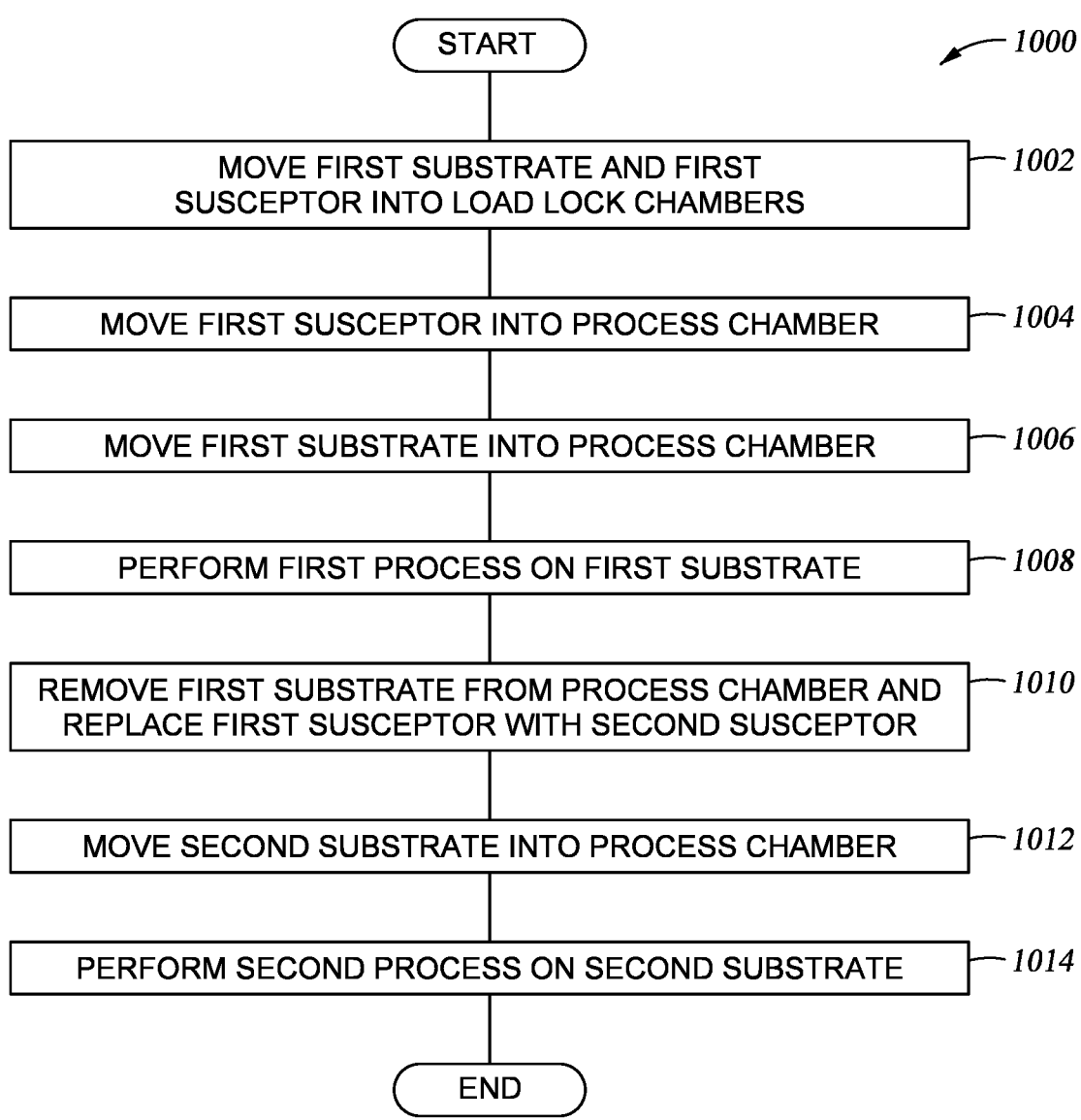
FIG. 3 is a process flow diagram of a method of moving one or more susceptors in the processing system of FIG. 1A, according to one embodiment.

FIG. 3 is a process flow diagram of a method 1000 of moving one or more susceptors 60 in the processing system 100 of FIG. 1A, according to one embodiment. The method 1000 is described in reference to FIGS. 1-3. The system controller 168 can execute a program stored in memory to perform the method 1000. The method begins at block 1002.

At block 1002, a first susceptor 60 and a first substrate 50 are moved from the FOUPs 136, 137 into load lock chambers. The first susceptor 60 can be moved from the FOUP 137 into the load lock chamber 106 by the transfer robot 134B. The first substrate 50 can be moved from the FOUP 136 into the load lock chamber 104 by the transfer robot 134A.

At block 1004, the first susceptor 60 can be moved from the load lock chamber 106 into the first process chamber 300A by the transfer robot 112 of the transfer chamber 108 during a first time period. The slit valve 365 can be opened to provide access for the transfer robot 112 to position the susceptor 60 inside the first processing chamber 300A. All of the enclosures in the processing system 100 can be designed to have openings (e.g., slit tunnels) that are sized to allow substrates 50 and susceptors 60 to be moved into each portion of the processing system 100.

At block 1006, the first substrate 50 can be moved from the load lock chamber 104 into the first process chamber 300A by the transfer robot 112 of the transfer chamber 108 to position the first substrate 50 on the first susceptor 60 during a second time period when the first susceptor 60 is in the first process chamber 300A. The second time period occurs after the first time period.

At block 1008, a first process is performed (e.g., a deposition) on the first substrate 50 in the first process chamber 300A during the second time period. All of the interior volumes of the processing system 100 can be maintained at a non-atmospheric pressure from the beginning of the first time period until the end of the second time period.

At block 1010, the first substrate 50 is removed from the first process chamber 300A, and the first susceptor 60 is then replaced with a second susceptor 60 during a third time period. The third time period occurs after the second time period. All of the interior volumes of the processing system 100 can be maintained at a non-atmospheric pressure from the beginning of the first time period until the end of the third time period. The second susceptor 60 can be provided from the FOUP 137 as described above or from on one of the optional storage chambers 120, 122.

Alternatively, in some embodiments, the first susceptor 60 and/or the second susceptor 60 can be provided to one of the load lock chambers 104, 106 or one of the storage chambers 120, 122 through the opening related to the corresponding removable lid or door to the external ambient environment 190 as described above. The interior of the load lock chamber 104, 106 or storage chamber 120, 122 can remain isolated from the interior of the transfer chamber 108 when the susceptor 60 is provided to load lock chamber 104, 106 or storage chamber 120, 122 using a removable lid or exterior door. If a susceptor 60 is provided to one of the load lock chambers 104, 106 or storage chambers 120, 122 through an opening related to the corresponding removable lid or door to the external ambient environment 190, then the pressure of corresponding load lock chamber 104, 106 or storage chamber 120, 122 can be adjusted (e.g., pumped down to vacuum pressure) to match the pressure of the transfer chamber 108 after the susceptor 60 is added and the corresponding lid is replaced or the exterior door is closed.

At block 1012, a second substrate 50 is positioned on the second susceptor 60 during a fourth time period when the second susceptor 60 is in the first process chamber 300A.

At block 1014, a second process is performed (e.g., a deposition) on the second substrate 50 in the first process chamber 300A during the fourth time period. The fourth time period occurs after the third time period.

In some embodiments, the second process is a different process than the first process. For example, the first process can be a deposition of a first layer formed from a first set of gases provided to the interior volume of the process chamber 300A while the second process can be a deposition of another layer formed from a different set of gases provided to the interior volume of the process chamber 300A. Furthermore, in some embodiments, the second susceptor 60 is a different susceptor than the first susceptor 60. For example, the second susceptor 60 can be formed of a different material or have a top surface with a different profile as well as other differences when compared to the first susceptor 60.

All of the interior volumes of the processing system 100 including the interior volumes of the FOUPs 136, 137, the docking station 132, the load lock chambers 104, 106, the transfer chamber 108, the storage chambers 120, 122, and the process chambers 300A, 300B can be maintained at an atmospheric pressure (e.g., 760 Torr), a non-atmospheric pressure, or vacuum pressure from the beginning of the first time period until the end of the fourth time period. Used herein, non-atmospheric pressure refers to a pressure that is at least 5% greater or at least 5% less than atmospheric pressure (i.e., 760 Torr). Used herein, vacuum pressure refers to a pressure that is less than 300 Torr. Furthermore, there is also little change in temperature or the mixture of gases (e.g., inert gases) in the different interior volumes of the processing system 100 when the substrates 50 and susceptors 60 are moved to and from the different enclosures in the processing system 100 because the movement of the substrates 50 and susceptors 60 is performed by components (e.g., transfer robots 134A, 134B, 112) located inside the processing system 100, and thus the interior volumes in the processing system are not exposed to the external ambient environment 190.

After block 1014, the second substrate 50 can be removed for subsequent processing. The processing system 100 can then continue processing substrates 50 in the chambers 300A, 300B using the same susceptors 60 or different susceptors 60. The susceptors 60 in the process chambers 300A, 300B can easily be exchanged with other susceptors 60 from the storage chambers 120, 122, the load lock chambers 104, 106 or the FOUPs 136, 137. The ease at which the susceptors 60 can be replaced in the process chambers 300A, 300B prevents downtime associated with the conventional manual replacement of susceptors and also makes it much easier to run different processes that call for the use of different susceptors that are not presently in one of the process chambers 300A, 300B.

While the foregoing is directed to examples of the present disclosure, other and further examples of the disclosure may be devised without departing from the basic scope thereof, and the scope thereof is determined by the claims that follow.

What is claimed is:

1. A method comprising:
moving a first susceptor from an interior volume of a first enclosure to an interior volume of a process chamber during a first time period with a robot;
transferring, during a second time period, a first substrate into the interior volume of the process chamber from a load lock chamber with the robot; and
positioning, during the second time period, the first substrate on the first susceptor in the process chamber, wherein the interior volume of the first enclosure and interior volume of the process chamber are maintained at a non-atmospheric pressure from a beginning of the first time period until an end of the second time period.

2. The method of claim 1, further comprising performing a first process on the first substrate in the interior volume of the process chamber during the second time period when the first substrate is on the first susceptor.

3. The method of claim 2, further comprising removing the first substrate from the process chamber and replacing the first susceptor in the process chamber with a second susceptor during a third time period, wherein the interior volume of the first enclosure and the interior volume of the process chamber are maintained at a non-atmospheric pressure from the beginning of the first time period until an end of the third time period.

4. The method of claim 3, further comprising positioning, during a fourth time period, a second substrate on the second susceptor when the second susceptor is in the process chamber, wherein the interior volume of the first enclosure and the interior volume of the process chamber are maintained at a non-atmospheric pressure from the beginning of the first time period until an end of the fourth time period.

5. The method of claim 4, further comprising performing a second process on the second substrate in the interior volume of the process chamber during the fourth time period when the second substrate is on the second susceptor, wherein the second process is different than the first process.

6. The method of claim 5, wherein the non-atmospheric pressure is a vacuum pressure.

7. The method of claim 1, wherein the first susceptor is moved through an interior volume of a second enclosure during the first time period, wherein the interior volume of the second enclosure is maintained at a non-atmospheric pressure during the first time period.

8. The method of claim 1, wherein
an interior volume of the load lock chamber is maintained at a non-atmospheric pressure during the first time period, and
the first susceptor is moved into the load lock chamber prior to the first time period through an opening of a removable lid or an exterior door of the load lock chamber.

9. The method of claim 1, wherein
the first susceptor is moved from a storage chamber including two or more susceptors to the process chamber during the first time period,
an interior volume of the storage chamber is maintained at a non-atmospheric pressure during the first time period, and
the first susceptor is moved into the storage chamber prior to the first time period through an opening of a removable lid or an exterior door of the storage chamber.

10. A method comprising:
moving, with a robot, a first susceptor from an interior volume of a first enclosure to an interior volume of a process chamber during a first time period; and
moving, with the robot, a first substrate from a load lock chamber to the interior volume of the process chamber during a second time period when the first susceptor is in the process chamber.

11. The method of claim 10, further comprising performing a first process on the first substrate in the interior volume of the process chamber during the second time period when the first substrate is on the first susceptor.

12. The method of claim 11, further comprising:
removing, with the robot, the first substrate from the process chamber during a third time period; and
replacing, with the robot, the first susceptor in the process chamber with a second susceptor during the third time period.

13. The method of claim 12, further comprising positioning, with the robot, a second substrate on the second susceptor during a fourth time period when the second susceptor is in the process chamber.

14. The method of claim 13, further comprising performing a second process on the second substrate in the interior volume of the process chamber during the fourth time period when the second substrate is on the second susceptor, wherein the second process is different than the first process.

15. The method of claim 14, wherein the interior volume of the process chamber and the interior volume of the first enclosure are maintained at a vacuum pressure from a beginning of the first time period until an end of the fourth time period.

16. A method comprising:

moving, with a robot, a first susceptor through a first opening of a process chamber from an interior volume of a first enclosure to an interior volume of the process chamber during a first time period; and moving, with the robot, a first substrate through the first opening of the process chamber from a load lock chamber to position the first substrate on the first susceptor during a second time period when the first susceptor is in the process chamber.

17. The method of claim 16, further comprising performing a first process on the first substrate in the interior volume of the process chamber during the second time period when the first substrate is on the first susceptor.

18. The method of claim 17, further comprising:

removing the first substrate from the process chamber through the first opening during a third time period; and replacing the first susceptor in the process chamber with a second susceptor during the third time period, wherein the first susceptor and the second susceptor are moved through the first opening to replace the first susceptor with the second susceptor.

19. The method of claim 18, wherein the interior volume of the process chamber and the interior volume of the first enclosure are maintained at a vacuum pressure from a beginning of the first time period until an end of the third time period.

* * * * *